(12) United States Patent
Rylander et al.

(10) Patent No.: US 8,456,176 B2
(45) Date of Patent: Jun. 4, 2013

(54) PASSIVE AGENT SYSTEM IMPEDANCE MONITORING STATION AND METHOD

(75) Inventors: Matthew Robert Rylander, Austin, TX (US); William Mack Grady, Round Rock, TX (US); Arshad Mansoor, Oak Ridge, TN (US); Frederic Gorgette, Paris (FR)

(73) Assignee: Electric Power Research Institute, Inc., Charlotte, NC (US)

( * ) Notice: Subject to any disclaimer, the term of this patent is extended or adjusted under 35 U.S.C. 154(b) by 578 days.

(21) Appl. No.: 12/573,937

(22) Filed: Oct. 6, 2009

(65) Prior Publication Data

US 2010/0085065 A1  Apr. 8, 2010

Related U.S. Application Data

(60) Provisional application No. 61/103,016, filed on Oct. 6, 2008.

(51) Int. Cl.
*G01R 27/04* (2006.01)
(52) U.S. Cl.
USPC .......................................... 324/629; 324/630
(58) Field of Classification Search
USPC ....................................................... 324/629
See application file for complete search history.

(56) References Cited

U.S. PATENT DOCUMENTS

| | | | | |
|---|---|---|---|---|
| 4,395,599 A | * | 7/1983 | Seidel | 327/594 |
| 4,459,436 A | * | 7/1984 | Rubin | 379/29.01 |
| 4,871,948 A | * | 10/1989 | Nelson | 315/368.13 |
| 5,587,662 A | | 12/1996 | Kelley et al. | |
| 5,631,569 A | | 5/1997 | Moore et al. | |
| 6,265,881 B1 | * | 7/2001 | Meliopoulos et al. | 324/691 |
| 6,713,998 B2 | | 3/2004 | Stanimirov et al. | |
| 6,801,044 B2 | | 10/2004 | Kesil et al. | |
| 7,164,275 B2 | | 1/2007 | Gasperi | |

OTHER PUBLICATIONS

Chirlian, Paul, Basic Network Theory, McGraw-Hill, 1969, p. 275-283, 350-355.*

* cited by examiner

*Primary Examiner* — Thomas Valone
(74) *Attorney, Agent, or Firm* — Trego, Hines & Ladenheim, PLLC (57) ABSTRACT

This invention relates to a hybrid passive agent system impedance monitoring station and method. The method of monitoring impedance of an electrical system includes the steps of providing an impedance monitoring station adapted to test and monitor system impedance, solving for system impedance in a time domain, solving for system impedance in a frequency domain, and determining a time domain driving point impedance and a frequency domain driving point impedance to identify the impedance of the system.

16 Claims, 9 Drawing Sheets

HARMONIC NUMBER

| | HARMONICS USED FOR WAVEFORM RECONSTRUCTION | | | | | |
|---|---|---|---|---|---|---|
| | 100 | | 50 | | 20 | |
| SAMPLING RATE | R | L(uH) | R | L(uH) | R | L(uH) |
| 100ksamp/sec | 0.40 | 64 | 0.40 | 65 | 0.40 | 68 |
| 50ksamp/sec | 0.41 | 61 | 0.41 | 63 | 0.40 | 66 |
| 20ksamp/sec | 0.43 | 60 | 0.42 | 62 | 0.42 | 65 |

PASSIVE AGENT SYSTEM IMPEDANCE MONITORING STATION AND METHOD

This application claims the benefit of Provisional Application No. 61/103,016 filed on Oct. 6, 2008.

BACKGROUND OF THE INVENTION

The present invention relates generally to an impedance monitoring station, and more particularly to a hybrid passive agent system impedance monitoring station and method.

System protection and personal safety is directly related to system impedance which specifies, by Ohm's law, the maximum current that can flow in a circuit. Despite the fact that system impedance is the most important parameter in determining arc fault current that will occur when a system is short circuited, electrical one-line diagrams are often not kept up-to-date with actual system wiring, making it difficult to determine system impedance.

Prior art methods of determining system impedance typically involves either solving only directly or interpretively the power frequency impedance. As a result, prior art methods encompass only limited information.

For example, one method used to measure system impedance requires the test load to be considerably large so that it creates a significant voltage drop between measurement points. The driving point impedance is determined in the time domain using the voltage drop between source and load, the associated current, and the current derivative. Two voltage measurements are required, but the method is unable to determine the change in voltage phase angle. This procedure is also subject to errors caused by capacitor banks in the system such that the resistance is over-estimated.

In another example, the procedure requires either passive or active harmonic current injection for frequency bands around the fundamental. This procedure is disclosed in U.S. Pat. No. 5,587,662. From the corresponding harmonic voltages induced, one can solve for the harmonic impedance in the frequency domain. The disadvantage of this procedure is that the solution can not be made for the driving point impedance due to the dominance of existing line voltage. The fundamental impedance must therefore be interpolated from the trend of harmonic impedances. The interpolation may be linear; however, it does not always have the same curve fit. This can occur in the situation that capacitor banks and resonance exist in the system. Resonance at low frequencies will cause the system inductance to be under-estimated.

Another procedure, disclosed in U.S. Pat. No. 7,164,275, inserts a capacitor into the system and uses the ringing frequency to determine the system inductance. In the presence of a capacitor bank, the known test capacitor will be in parallel with the bank. The system inductance will then be subject to erroneous results. The system inductance is then used to determine the system resistance looking at the magnitude of voltage drop caused by a resistive load. When the system is contaminated with voltage harmonics, the use of magnitude voltage drop will further increase error.

Additional methods, such as those disclosed in U.S. Pat. Nos. 6,713,998, 6,801,044, and 5,631,569, measure the system impedance in the time domain. These methods require making multiple voltage measurements along the energized line in question. The driving point impedance is determined with the voltage drop, the associated current, and the current derivative. It is problematic that the waveforms do not align with the appropriate time stamp or phase angle when two voltage measurements are taken at different locations. Along this length of line, it is also possible for other radial loads. The voltage drop would therefore not be associated with the current measured at either end of the line in question.

BRIEF SUMMARY OF THE INVENTION

These and other shortcomings of the prior art are addressed by the present invention, which provides a passive agent system impedance monitoring station for determining and monitoring a systems impedance.

According to one aspect of the present invention, a method of monitoring impedance of an electrical system includes the steps of providing an impedance monitoring station adapted to test and monitor system impedance; solving for system impedance in a time domain; solving for system impedance in a frequency domain; and determining a time domain driving point impedance and a frequency domain driving point impedance to identify the impedance of the system.

According to another aspect of the present invention, a method of monitoring impedance of an electrical system includes the steps of providing an impedance monitoring station having software installed thereon and adapted to test and monitor system impedance, running an initialization test using the software to compare an actual load current to reconstructed current waveforms, and taking Thevenin equivalent source measurements for voltage and current. The invention further including the steps of using Fast Fourier Transform to reduce the influence of noise and momentary changes in waveforms, analyzing data and reconstructing waveforms for voltage and current, solving for system impedance in a time domain using Least Squares, solving for a Thevenin source voltage and a Thevenin source phase angle, calculating a non-conduction voltage error to determine if a direct solution is under or over estimated, calculating harmonic impedance in a frequency domain, and determining a time domain driving point impedance and a frequency domain driving point impedance to identify the impedance of the system.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
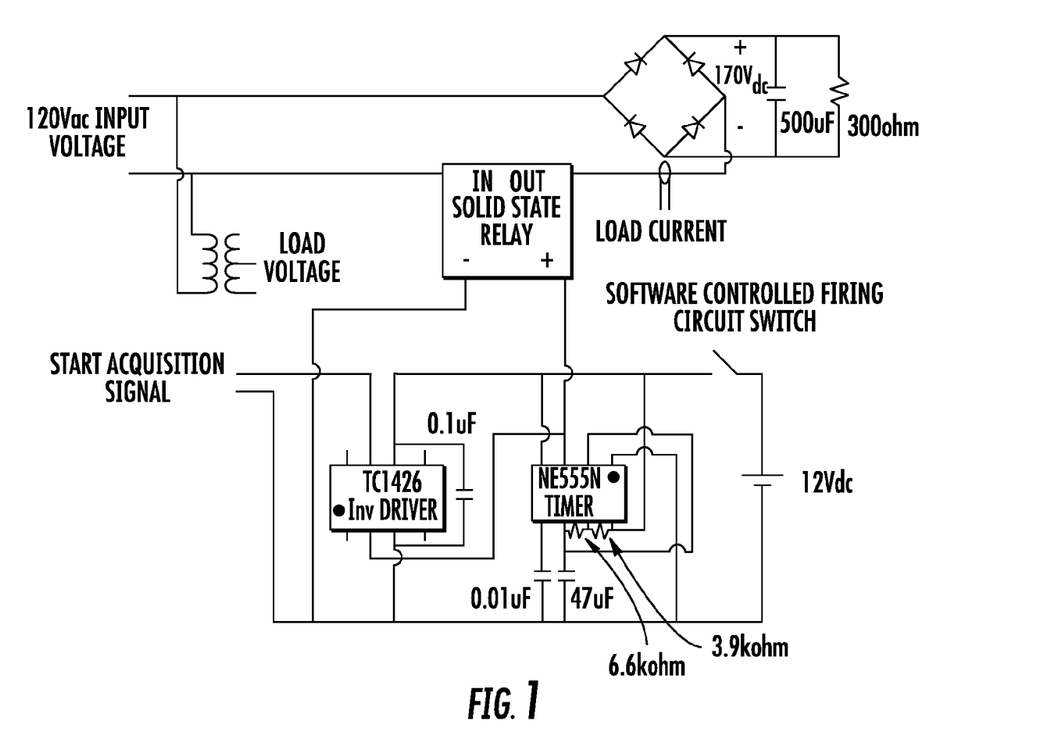
FIG. 1 is a schematic of a passive agent system impedance monitoring station.

Referring to the drawings, an exemplary passive agent system impedance monitoring station (PASIMS) constructed according to the present invention is illustrated in FIG. 1. PASIMS incorporates two techniques to solve for system impedance. The first technique is to solve for system impedance in the time domain using actual system response. The second is to solve the system impedance in the frequency domain by interpolating the impedance from individual harmonic current and voltage measurements.

Figure 2:
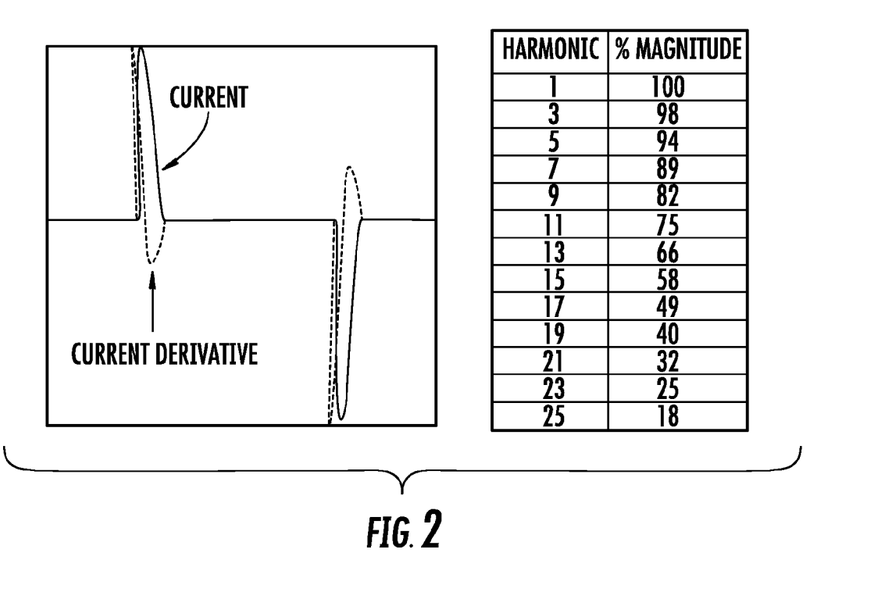
FIG. 2 shows an actual time domain voltage dip due to a power electronic load current.

The time domain technique uses the actual time domain response of the system due to the power electronic load. This results in a dip in voltage only at the peak of the voltage waveform. This is due to the power electronic load being designed to have an approximately 5% DC voltage ripple. For PASIMS, a relatively small load (100 W on rectified 120Vac or 350 W on rectified 277Vac) causes a significant voltage dip as seen in FIG. 2.

Figure 3:
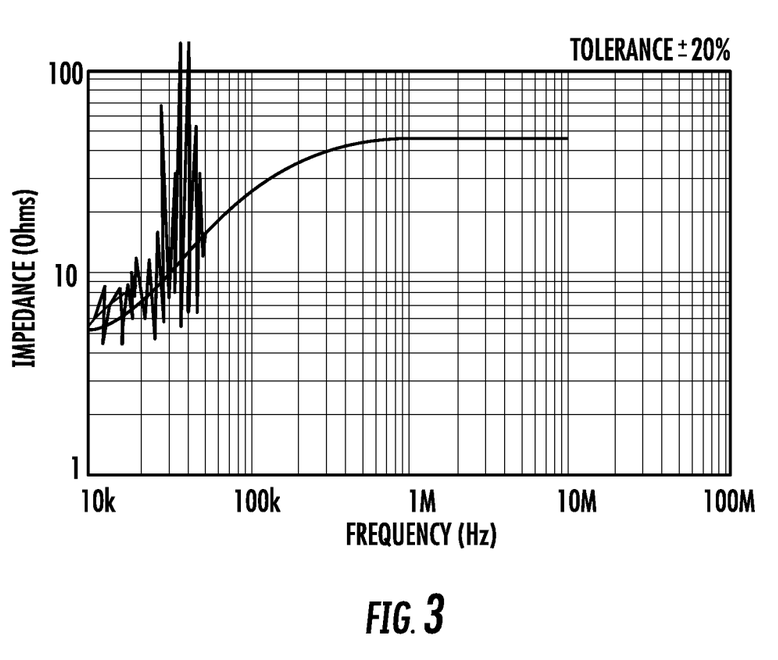
FIG. 3 shows a basic schematic for a power system with power electronic load during a conduction interval.

The initial procedure for measuring system impedance is to take the actual load voltage and fit it with power electronic load components like those shown in FIG. 3. From this, the associated load current can be determined. Working from the load back to the system, the best fit impedance to match a Thevenin equivalent source voltage can be solved.

Another approach would be to use the power electronic load dynamic response equation to solve for system impedance. The power electronic load has a DC capacitor to store charge for the part of the cycle in which the load is effectively disconnected from the system. This occurs when the AC voltage is less than the DC capacitor voltage. The DC capacitor receives the majority of power during the conduction period to restore what was displaced during non-conduction. The dynamics of this circuit can be described with the following second-order linear differential equation:

$$V_{Th}(t) = L_S C_L \frac{d^2 V_L(t)}{dt^2} + \left(R_S C_L + \frac{L_S}{R_L}\right)\frac{dV_L(t)}{dt} + \left(\frac{R_S}{R_L} + 1\right)V_L(t)$$

which can be reduced because $$R_S C_L \gg \frac{L_S}{R_L} \text{ and } \frac{R_S}{R_L} \ll 1,$$

yielding $$V_{Th}(t) = L_S C_L \frac{d^2 V_L(t)}{dt^2} + R_S C_L \frac{dV_L(t)}{dt} + V_L(t).$$

This equation can be used to solve in the time domain the system impedance using only voltage data and Least Squares over the conduction interval; however, the actual voltage waveforms must have a significantly small amount of noise to make it possible to attain the second derivative of load voltage either numerically or using the Fast Fourier Transform (FFT). Reducing noise with sampling capacitors or filters is problematic due to the slew of the filtered waveform. Sharp signals are necessary to solve using Least Squares. Noise has been found to be problematic and leads to a more refined approach.

The power electronic load conduction current is more attractive over a 60 Hz current because it has a high magnitude with a steep slope over a short duration providing a significant derivative with minimal influence from noise. Using the actual load conduction current and actual change in voltage, one can bypass the load dynamics and directly solve in the time domain for the system impedance using Least Squares over the conduction interval with the following equation:

$$V_{Th}(t) = R_S \cdot i(t) + L_S \frac{di(t)}{dt} + V_L(t).$$

The initial solution assumes the Thevenin equivalent source and load voltage are in-phase. The solution is then used to solve for a new Thevenin equivalent source voltage phase angle. Shifting the waveform, resolving system impedance, and repeating the process results in a convergent solution for system impedance.

Figure 4:
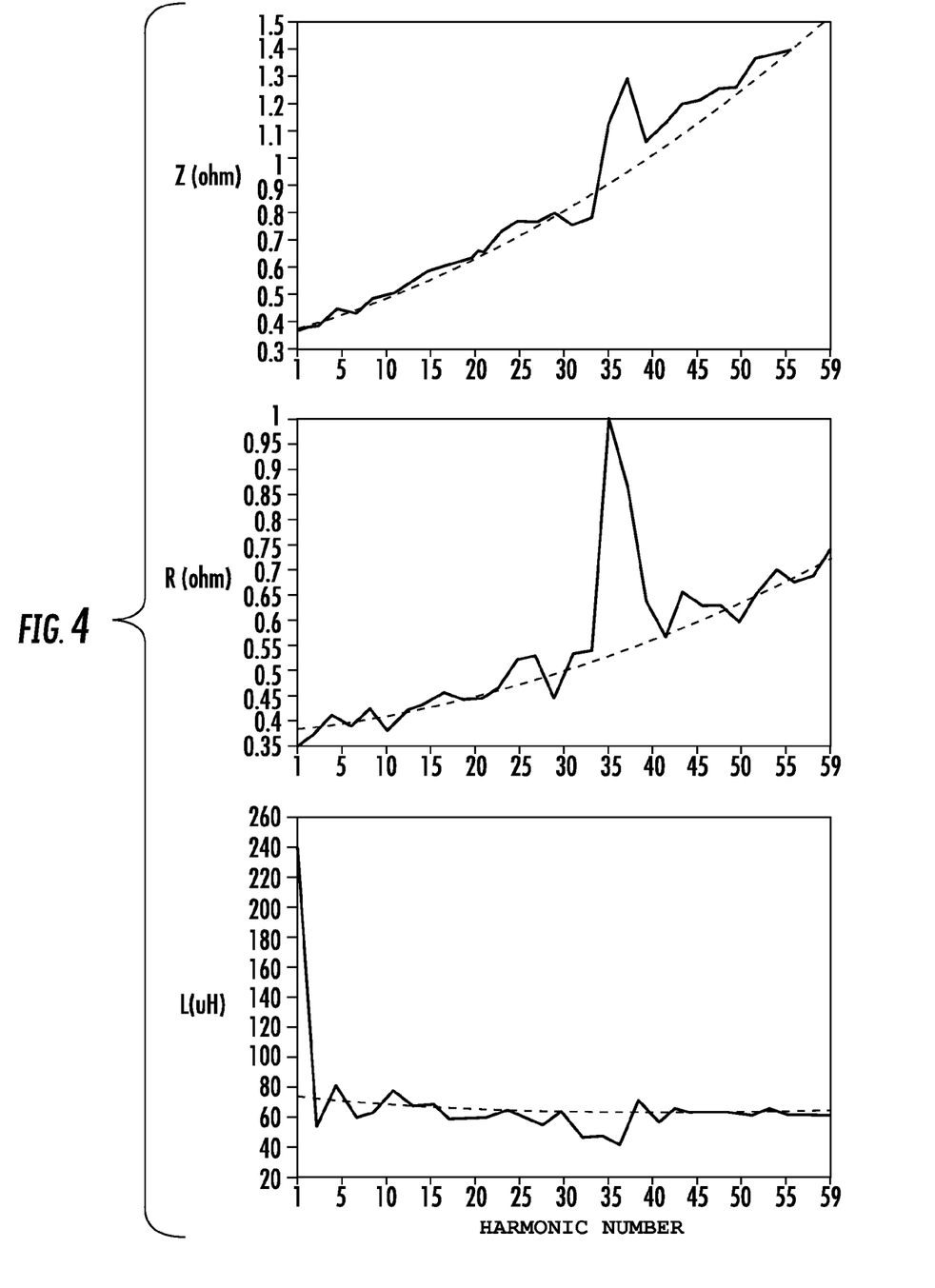
FIG. 4 shows a typical power electronic load current waveshape for one power frequency cycle with current magnitudes to the right of the waveform normalized to the fundamental.

The frequency domain uses the characteristics of the power electronic load to determine frequency domain harmonic system impedance. Any load, specifically those whose current waveform is rich with harmonics besides the fundamental, can inject harmonics into the power system. These loads are passive agents in which under normal operation, they inject harmonic current into the system. A typical power electronic load current has the waveshape seen in FIG. 4. The harmonic current magnitudes can be seen to the right of the waveform normalized to the fundamental.

The dominant frequencies include the fundamental through the $7^{th}$ harmonic. The harmonics not listed, odd and even, are each less than 15%. Each current frequency introduces a corresponding harmonic voltage due to the harmonic impedance. The harmonic impedance can therefore be solved by using the difference in harmonic voltage during and prior to when the passive load was placed online and the harmonic current by:

$$Z_h = \frac{\Delta V_h}{I_h}.$$

Figure 5:
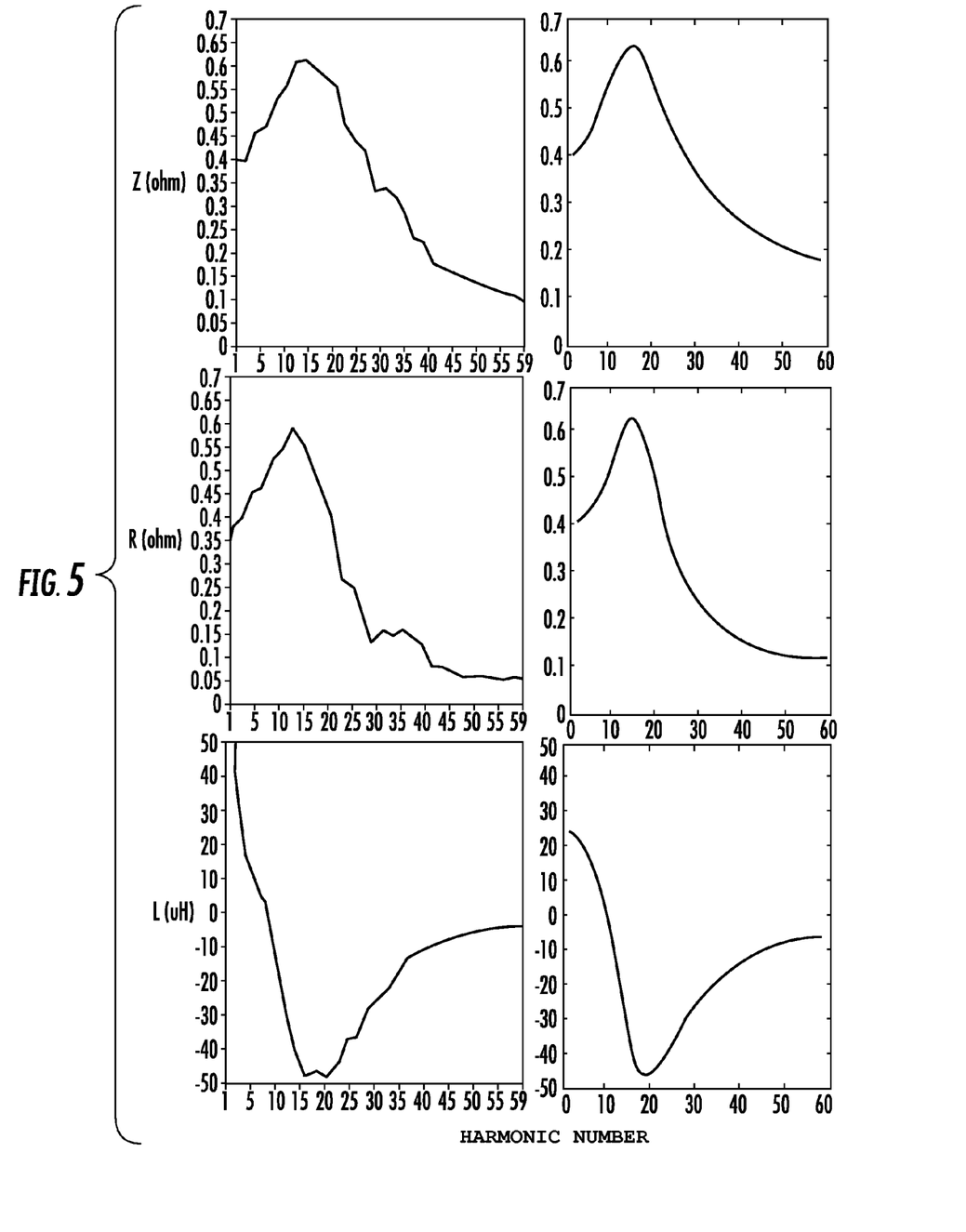
FIG. 5 shows a known impedance of a Line Impedance Stabilization Network for 10 kHz-10 MHz.

Using a Line Impedance Stabilization Network (LISN) in accordance to standard MIL-STD-461E, the impedance of the source providing input power to PASIMS is controlled regardless of the power system. The LISN then controls the impedance seen by PASIMS in the range of 10 kHz-10 MHz. The magnitude of current injected from PASIMS at these frequencies is low; however, impedances could still be determined. When using the LISN, the trend of calculated harmonic impedances for 10 kHz-48 kHz match within the given tolerance as seen in FIG. 5.

Figure 6:
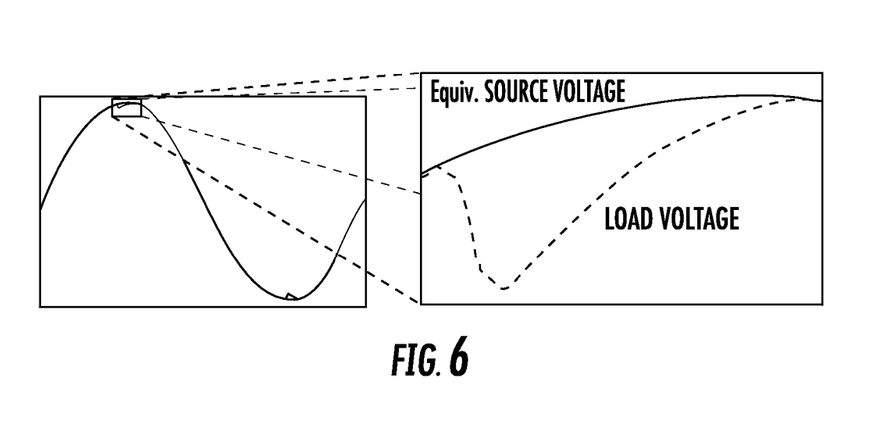
FIG. 6 shows actual 120Vac calculated frequency domain impedances along with a dashed trend-line.

The harmonic solution also works well for low-order harmonics; however, the line voltage causes errors in the solution at the power frequency. The harmonic system impedance at a 120Vac lab outlet is plotted in FIG. 6 for odd harmonics through the $59^{th}$ multiple. It can be seen that the power frequency solution for inductance is higher than the trend of harmonic inductance would predict. The solution at the power frequency can not be directly determined with this approach, and therefore must be interpolated from non-fundamental harmonics.

If there were a capacitor bank on the system near the point of measurement, then the frequency domain impedance scan would show an increase in impedance near the resonant frequency. At the resonant frequency, the parallel impedance of the system and capacitor causes the derived impedance to increase due to the cancellation of the harmonic inductive and capacitive terms.

Figure 7:
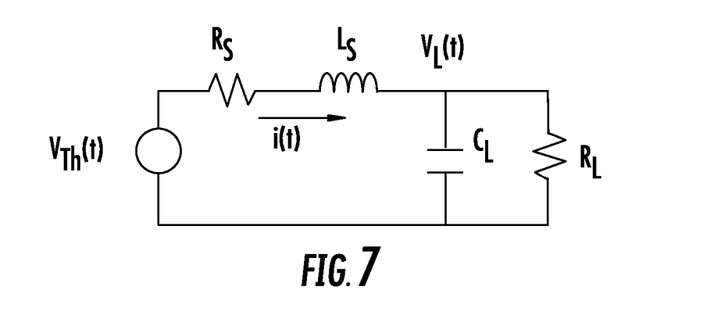
FIG. 7 shows resonance in a frequency domain impedance magnitude (Z) scan near the $17^{th}$ harmonic using a 315 uF capacitor bank on a 120Vac system.

Capacitor banks have a significant impact on the harmonic impedance when the resonance is near the fundamental. On the same system as in the previous example where $R_s=0.4$ Ohms and $L_s=74$ uH, a 315 uF ($\approx$2 kVAr) capacitor bank will cause resonance near the $17^{th}$ harmonic. This resonance can be seen in the impedance scan of FIG. 7. To the right of these, the impedance scans are analytically solved for the system parameters and an approximate capacitor bank resistance of 0.1 Ohm. In the presence of this capacitor bank, interpolating the driving point inductance gives under-estimated results while the interpolated resistance remains accurate.

Referring again to FIG. 1, the Passive Agent System Impedance Monitoring Station (PASIMS) is a hybrid combination of using passive current injection and load variation to measure power frequency impedance and determines resistance, inductance, and resonance. Using both procedures provides a way to check the system impedance results. Under most system configurations the results will be equal; however, in the case of resonance, the results will vary. In resonant conditions, which can be seen in the frequency domain impedance scan, FIG. 7, the interpolated frequency domain resistance remains closer to the actual system resistance while the time domain inductance remains closer to the actual system inductance. Using both techniques in resonant conditions is important because individually, the frequency and time domain methods are subject to errors in resonant conditions. In other conditions, the time domain solution provides more accurate driving point impedance results because no interpolation is necessary.

Time domain methods using 60 Hz loads do not determine the appropriate voltage phase angle at the time of measurement with respect to the actual Thevenin voltage phase angle. Using a power electronic test load, a more accurate time domain initial solution for impedance can be determined using a short but steep pulse of current. The Thevenin voltage phase angle is adjusted, and the procedure is repeated until solution converges.

PASIMS uses a passive agent load to inject harmonic current into the system whose combination of harmonics creates a significant voltage drop between source and load. PASIMS therefore uses the actual voltage drop to measure the time domain driving point impedance while the frequency domain driving point impedance is interpolated and used to verify the results and identify system resonance.

PASIMS incorporates a power electronic load which draws distorted current for one short interval every half cycle. This current is rich in the low-order harmonics (i.e., $3^{rd}$, $5^{th}$, and $7^{th}$) with approximately the same magnitude as the fundamental. This current causes a significant voltage drop between the source and load during the time of conduction. The Thevenin equivalent source voltage when no load is applied, the load voltage when the power electronic load is applied, corresponding load current, and the Fourier derivative of current are then used to calculate the time domain power-frequency impedance between the source and load.

The magnitude of low-order harmonics also provides accurate low-order harmonic impedances which are used to interpolate the frequency domain power-frequency impedance.

Because PASIMS uses a hybrid approach, PASIMS provides a wealth of information in a simplistic design. Further, PASIMS provides:

1. a single data acquisition point and online testing;
2. a safe, portable, and quick procedure;
3. a low power load (i.e., 350 W on 277Vac or 100 W on 120Vac);
4. a passive load that injects a wide band of current frequencies used to determine frequency domain impedance;
5. a time domain driving point impedance determined from power electronic load voltage drop, current, and derivative of current;
6. a time domain distorted current of primarily low-order with steep slope necessary to determine accurate inductive voltage drops;
7. a magnitude of current pulse to create necessary voltage drops to determine accurate resistance;
8. actual waveforms reconstructed using Fourier series, thus reducing noise;
9. FFT to average the Thevenin equivalent source and load waveforms over 60 cycles to filter momentary changes in the system and provide more accurate FFT results;
10. a recursive procedure that shifts Thevenin equivalent open circuit voltage phase angle and solves for impedance until the solution converges;
11. the ability to provide multiple tests and give average value results with small standard deviation; and
12. perform resonance and voltage error checks since the presence of capacitor banks cause resonance in the impedance scan which effects the results. Further, errors are determined from the difference in Thevenin source and load voltage during power electronic load non-conduction intervals.

PASIMS is adapted to provide source impedance testing such as line-to-line, line-to-neutral, arc flash hazard, and incident energy. Further PASIMS provides transformer series impedance testing, component series impedance testing, and identification of resonance and capacitor banks.

PASIMS may be implemented to three-phase allowing the impedance of $Z_{ab}$, $Z_{bc}$, and $Z_{ca}$ to be determined. Using the two sets of three equations and three unknowns, $$R_{ab} + j\omega L_{ab} = (R_a + R_b) + j\omega(L_a + L_b),$$
$$R_{bc} + j\omega L_{bc} = (R_b + R_c) + j\omega(L_b + L_c),$$
$$R_{ca} + j\omega L_{ca} = (R_c + R_a) + j\omega(L_c + L_a),$$

one can solve for the individual conductor impedances. Knowing these, one can then solve the impedance of $Z_{ln}$, and determine the neutral conductor impedance:

$$R_{an} + j\omega L_{an} = (R_a + R_n) + j\omega(L_a + L_n).$$

For industrial applications, the phase-to-phase mutual impedance is negligible and can therefore be neglected. The impedance measured will approximately be the positive sequence impedance.

Figure 8:
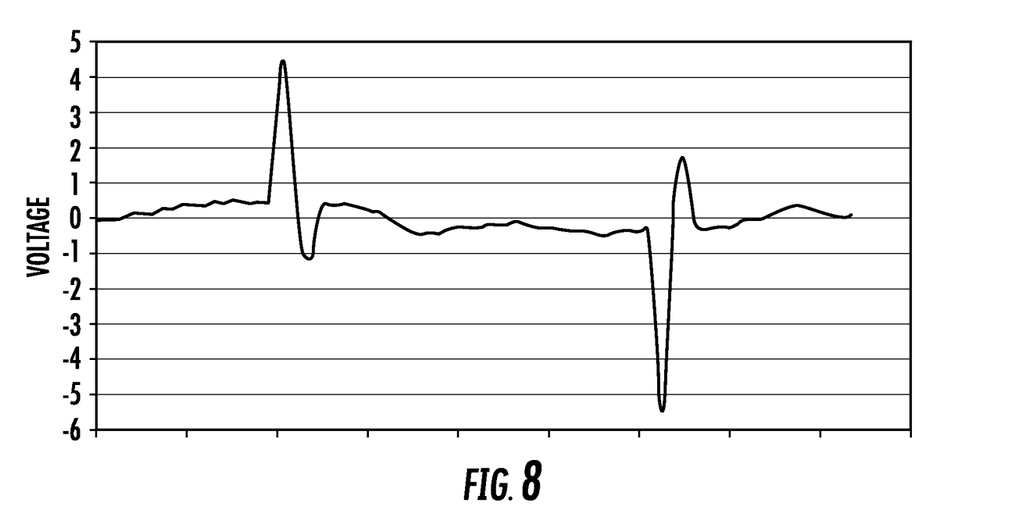
FIG. 8 shows an over-estimated time domain solution due to a change in large nearby loads using a voltage drop waveform during one power frequency cycle.

Error in the power frequency time domain solution can exist if nearby feeder load is changing. The more time elapsed between Thevenin equivalent source and load measurements can increase the chance of large loads coming on-line or going off-line. These changes in load are easily identified by the difference between load and source voltage waveforms during the non-conduction interval of PASIMS test load. The time domain difference should be zero between test load conduction intervals if the system remains constant; however, if the equivalent source voltage is greater than the load voltage as in FIG. 8, the system impedance will be over-estimated because it looks as if there was a greater voltage drop. If the equivalent source voltage is less than the load voltage, the system impedance will be under-estimated. By Ohm's law, system resistance is proportional to voltage drop such that $$V_{drop} + \Delta V = I \cdot (R + \Delta R) \text{ and } \Delta R = \frac{\Delta V}{I}.$$

Typical noise will cause the change in voltage to oscillate by a small amount around zero during the non-conduction interval, but this has a negligible impact on the results. If the absolute value of 60 Hz change in non-conduction voltage is greater than 0.064% of system voltage, the station will report that the impedance error is significant. In resonant conditions the error will always appear to be large and therefore must be disregarded.

In use, the PASIMS software is started and an initialization test is run. The initialization test compares actual load current to reconstructed current waveforms, chooses conduction cycle points to be solved with Least Squares estimation, and if changes are made, restarts the software. In comparing actual load current to reconstructed current, 100 harmonics are typically sufficient for a typical power electronic current; however, in the presence of capacitor banks or flattened building voltage, as many as 300 harmonics may be necessary. Also, if actual and reconstructed current waveforms look different, an increase in the number of harmonics is used for waveform reconstruction.

In choosing conduction cycle points to be solved, the fundamental current phase angle is determined automatically to begin near the onset of the current conduction interval and continues until the current goes back to zero. The entire load conduction interval provides best results when no resonance is visible in a harmonic impedance scan. Also, if there is resonance and a transient in-rush of current from the capacitor bank to the power electronic load each half cycle, the second half of the conduction cycle is chosen.

Once the initialization test is run, Thevenin equivalent source (open circuit) measurements are made for 2.5 seconds for voltage and current at 100 ksamp/sec with a 16 bit data acquisition card while the load is 'off'. Then, a solid state relay controlled by a timer provides isolation and turns the power electronic load 'on' for 2.5 seconds while load measurements continue to be made. These may be repeated for a desired number of tests.

FFT is then performed over 60 cycles of Thevenin source measurements and over 60 cycles of steady state load waveform measurements. The steady state load waveform measurements occur no earlier than 10 cycles after load turns 'on'. In-rush transient to load is not desired and the Thevenin source and load FFT's should be close together in time to minimize chance of nearby load change. FFT then averages the cycles, thus reducing influence of noise and momentary changes in waveforms.

Next, the data is analyzed by reconstructing the waveforms for voltage and current. This is done by creating a waveform for load current derivative by differentiating the Fourier series of load current—one cycle reconstruction with 1667 points has been found adequate and more time efficient without effecting results. At this time, the voltage fundamental when load is 'off' is assumed in-phase with the voltage fundamental when load is 'on', the Thevenin source and load waveforms are aligned in-phase, and the DC offset of current probe is determined by observing DC component of FFT while the load is 'off'. In an open circuit, current should be zero.

Next, the time domain with Least Squares iteration n of system impedance
$R^{(n)}$ and $L^{(n)}$ is solved using the over-defined equation $$[V_{Th}(t) - V_L(t)] = \left[ I_L(t) \frac{dI_L(t)}{dt} \right] \cdot \begin{bmatrix} R^{(n)} \\ L^{(n)} \end{bmatrix}$$

where $V_{Th}$ is the Thevenin equivalent source voltage $V_L$ is the load voltage $I_L$ is the load current, $dI_L/dt$ is the derivative of load current, R is the system resistance, and L is the system inductance.

After the best solution is determined, a new Thevenin source voltage is solved using $$V_{Th}(t) = \left[ I_L(t) \frac{dI_L(t)}{dt} \right] \cdot \begin{bmatrix} R^{(n)} \\ L^{(n)} \end{bmatrix} + V_L(t),$$

and a new Thevenin source phase angle is calculated using the FFT. The actual Thevenin source voltage is shifted, and $R^{(n+1)}$ and $L^{(n+1)}$ are determined. This recursive approach is followed until the solution converges. The number of iterations necessary for the solution to converge depends on the magnitude of the source impedance.

The non-conduction voltage error is then calculated to determine if the direct solution is under- or over-estimated. A change in non-conduction voltage identifies drop or increase of large nearby loads. Fundamental change between load and Thevenin source voltage should be minimized—less than 0.064% fundamental voltage change is adequate for good results. Next, the Frequency domain harmonic impedance using change in harmonic voltage when load is 'off' and 'on' along with harmonic current is solved by:

$$Z_h = \frac{\Delta V_h}{I_h}.$$

It should be appreciated that the complex harmonic impedance is split into real and imaginary components to determine resistance and inductance; the driving point impedance must be interpolated from trend of non-fundamental harmonics; the type of interpolation depends on the system conditions such as resonance; the $3^{rd}$ harmonic closely resembles driving point impedance; and if resonance is near fundamental, use frequency domain interpolated driving point resistance and time series inductance. Once this is done, the results are plotted and the software stops.

Using the PASIMS system and methods above, several tests were conducted—120Vac insertion, 120Vac parallel load, 120Vac scan rate and waveform reconstruction, 277Vac insertion, and 277 Vac location variation.

120Vac Insertion

Figure 9:
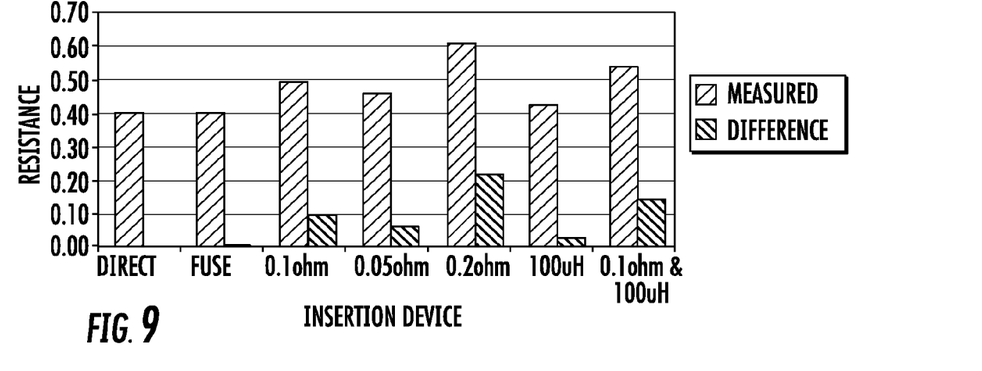
FIG. 9 shows an average resistive time domain solution for several series insertion devices on a 120Vac circuit.

Several series insertion devices were used to analyze the time domain solution for series impedance. The six insertion devices include a fuse, 0.1 Ohm resistor, 0.05 Ohm resistor, 0.2 Ohm resistor, 100 uH inductor with DCR <0.03 ohm, and 0.1 Ohm resistor in series with 100 uH inductor. Each insertion device was compared to the solution from a direct connection to extract the resistance of the insertion device. Five tests were used in each situation, and the averages were taken and plotted in FIG. 9. In each situation, the new system resistance changed by approximately the rating of the insertion device. PASIMS could also determine that components such as the insertion fuse and terminal connections increased system resistance. The standard deviation of results for each insertion device is approximately 0.015 Ohms and 1 uH. The error in individual test results can be identified by the difference in voltage during and prior to the application of test load while in non-conduction. The difference should be zero between conduction intervals if the system remains constant; however, if large loads come on-line or drop from the system, the time domain solution for system impedance will incur error. Using the voltage error check, solutions with error can be identified and the impedance error can be further minimized.

120Vac Parallel Load

It is possible that when testing system impedance there will be other loads online that will obscure the test results. In most cases, the impedance of these other loads will be at least 20 times larger than the system impedance and therefore not affect the solution. However, parallel loads such as other power electronics or capacitor banks can obscure the results.

The worst case is when a parallel load is an unloaded capacitor bank located near the measurement point; however, the transient in-rush from the bank to the station decays fast enough that the Least Squares solution remains similar to that solved if the bank did not exist. If there is an inductance between the bank and the station, the transient will take longer to decay, but the solution will only be slightly skewed due to the location of the bank.

Figure 10:
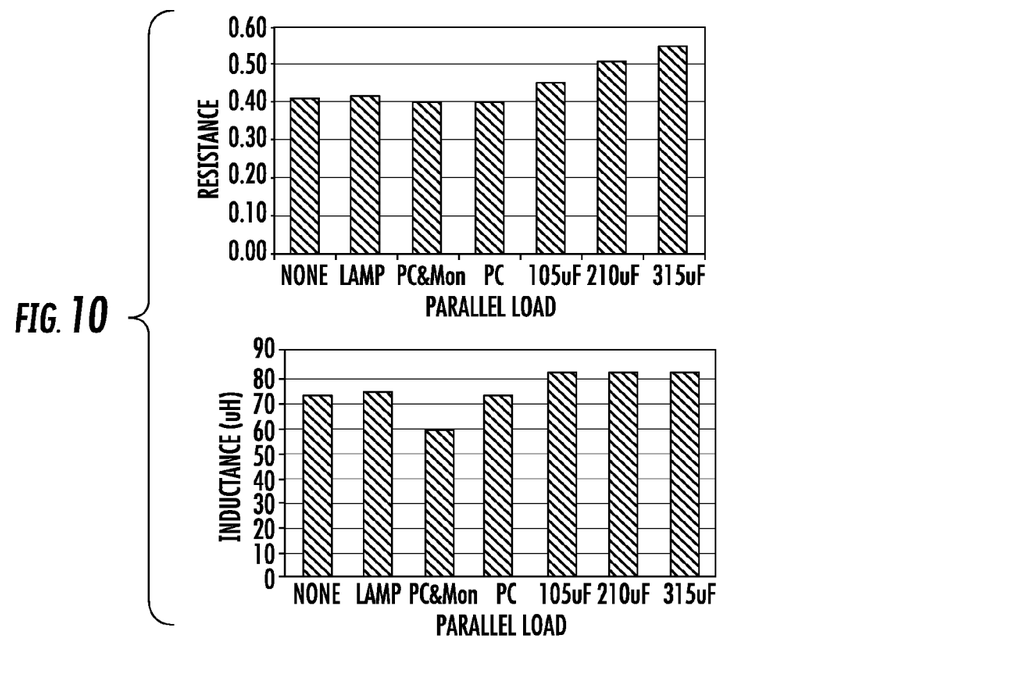
FIG. 10 shows a 120Vac circuit impedance time domain results with several different parallel loads.

Similar to PASIMS, other power electronic loads take a significant amount of power at the peak of the voltage waveform and can alter the results of the station. In FIG. 10, the time domain results are given for several different parallel loads including various capacitor banks, a personal computer (40 W), personal computer and monitor (120 W), and a large incandescent lamp bank (400 W). In each situation, the system impedance changes due to the influence of the parallel load. The greatest consequence is the increase in system resistance for the 315 uF capacitor bank and the decrease in system resistance and inductance for the large power electronic load.

Large capacitor banks, identified by resonance near the fundamental, have a significant impact on the time domain system impedance. A purpose of a capacitor bank is for voltage support, increasing the voltage at the receiving end of the line. Therefore, an unloaded capacitor bank will cause the measured Thevenin equivalent open circuit source voltage to appear greater than the actual system source voltage. When the PASIMS load is placed on-line, the capacitor bank becomes loaded and the voltage difference will appear to be caused by a larger resistive voltage drop. Therefore, resistance is over-estimated while inductance remains closer to the actual value.

120Vac Scan Rate and Waveform Reconstruction

Figure 11:
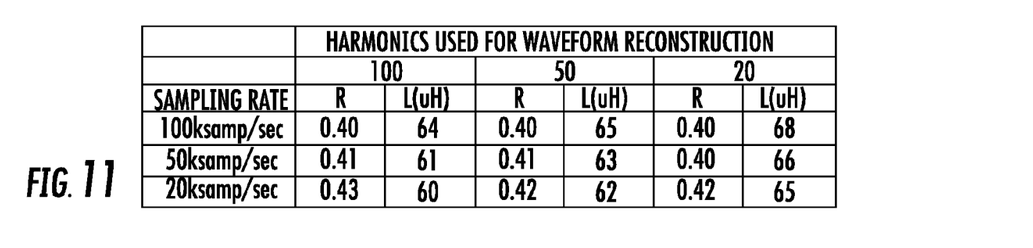
FIG. 11 shows lower sampling rates result in higher R and lower L while lower reconstruction harmonics result in lower R and higher L.

It was found that the sampling rate has an effect on the time domain solution. As shown in FIG. 11 for five test averages, lower sampling rates result in higher R and lower L while lower harmonics results in lower R and higher L. 100 ksamp/sec over three cycles is necessary for good FFT results to reconstruct the actual waveform. Lower sampling would be sufficient if more cycles were to be averaged with the FFT.

The typical power electronic load current can be reconstructed with as low as 20 harmonics; however, higher harmonics are necessary for good inductance results. Higher harmonics are also necessary when capacitive loads are located nearby which cause an in-rush transient at the onset of the conduction interval. In this case, the harmonic magnitudes are altered from those in FIG. 4, and as many as 300 harmonics are necessary for waveform reconstruction.

277Vac Insertion

Figure 12:
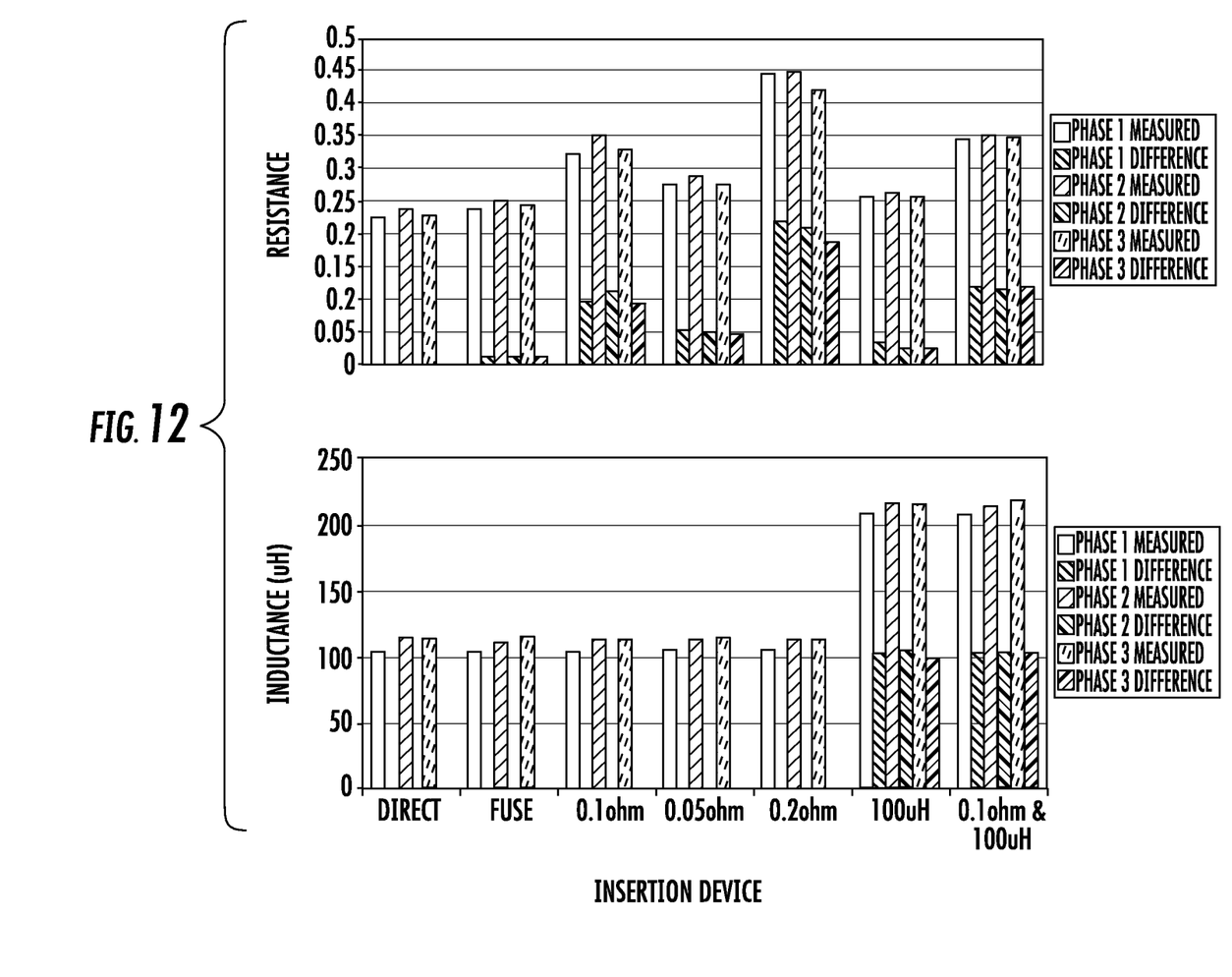
FIG. 12 shows resistance and inductance time domain results for each of three 277Vac phases with insertion devices.

With simple modification to maintain 5% DC voltage ripple, PASIMS was then tested at 277Vac. Again with the same insertion devices as in the 120Vac test, one can determine the insertion device impedance. In FIG. 12, the resistance and inductance are solved in the time domain for different insertion devices and plotted for each of the three phases. The plotted results are the average of five tests with an approximate standard deviation of 0.01 Ohms and 1 uH. In each situation, the increased impedance is approximately the insertion components rated value.

277Vac Location Variation

Figure 13:
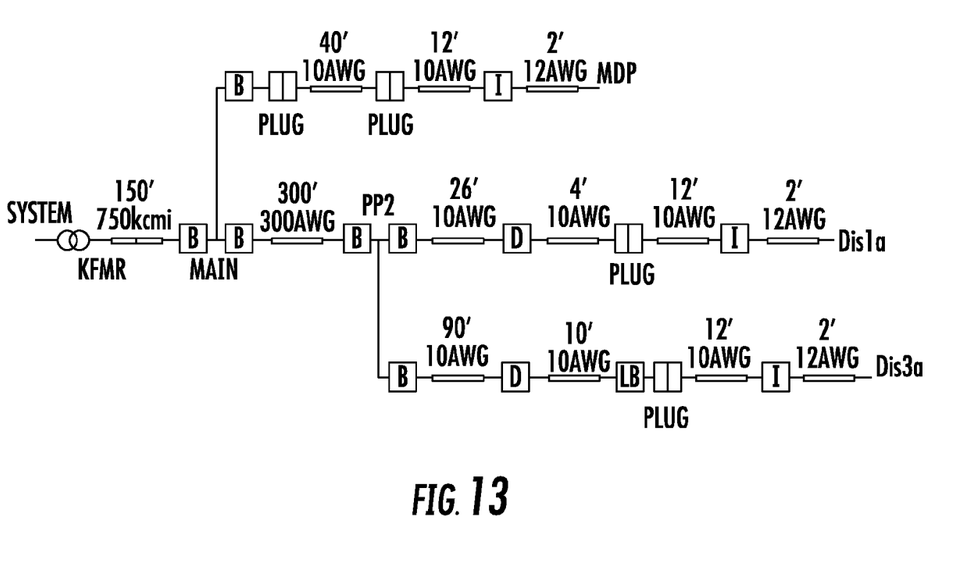
FIG. 13 shows a radial 480Vac building circuit one-line diagram.

The next test was to solve for the system impedance on a known circuit. The building circuit one-line diagram can be seen in FIG. 13 along with miscellaneous connections, breakers, and other elements that cause additional impedance. There were three test locations on the circuit fed from the building transformer: MDP (near main disconnect panel), Dis1a (near sub-panel PP2), and Dis3a (off sub-panel PP2). At each test location, the difference in phase impedance is due to circuit elements such as cables, connections, and switches between locations. Cable impedance was approximated using values from UGLY's Electrical Reference, and the remaining connections were taken into consideration having a small ($\approx 3$ milliohms) but important series resistance. The remaining line impedance is up to the high side of the Y-Y 7620/480V, 300 KVA, 3.17% Z building transformer. Using these ratings and X/R=1.5, the transformer resistance would be approximately 0.014 Ohms, and the inductance would be approximately 54 uH.

Figure 14:
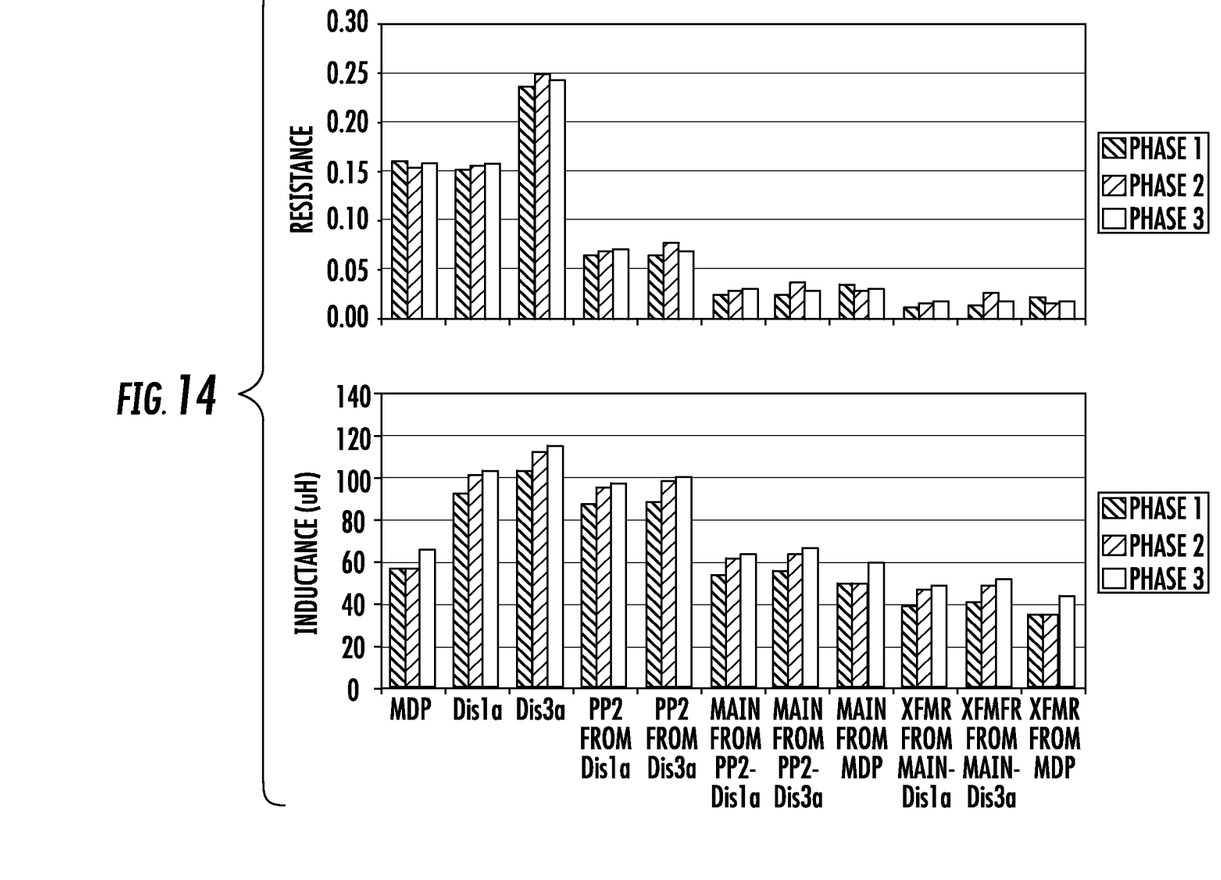
FIG. 14 shows time domain results for impedance at three 277Vac test locations and calculated back to points of a common coupling.

Using the time domain solution, five tests give a good average for each phase and location with a standard deviation of approximately 0.01 Ohms and 1 uH. The results for the three test locations are given in FIG. 14. The impedance from Dis3a and Dis1a can be used to work back to the sub-panel breaker PP2, and then further to the Main breaker where the system impedance is similar to the impedance calculated back from MDP. Furthermore, each location can be used to work back to the building transformer impedance. Variations in results per phase are most easily identified as differences in cable and contact impedances along with how well terminals are connected together.

The foregoing has described a passive agent system impedance monitoring station. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A method of monitoring impedance of an electrical system, comprising the steps of:
    (a) providing an impedance monitoring station having software installed thereon and adapted to test and monitor system impedance;

(b) running an initialization test using the software to compare an actual load current to reconstructed current waveforms;
(c) taking Thevenin equivalent source measurements for voltage and current;
(d) using Fast Fourier Transform to reduce the influence of noise and momentary changes in waveforms;
(e) analyzing data and reconstructing waveforms for voltage and current;
(f) solving for system impedance in a time domain using Least Squares;
(g) solving for a Thevenin source voltage and a Thevenin source phase angle;
(h) calculating a non-conduction voltage error to determine if a direct solution is under or over estimated;
(i) calculating harmonic impedance in a frequency domain; and
(j) determining a time domain driving point impedance and a frequency domain driving point impedance to identify the impedance of the system.

2. The method according to claim 1, further including the step of choosing conduction cycle points to be solved by Least Squares estimation.

3. The method according to claim 2, wherein in choosing conduction cycle points, a fundamental current phase angle is determined automatically to begin near an onset of current conduction interval and continues until the current reaches zero.

4. The method according to claim 1, wherein in the step of comparing actual load current to reconstructed current waveforms, one-hundred harmonics are used to reconstruct the current waveforms.

5. The method according to claim 1, wherein the Thevenin equivalent source measurements are taken for 2.5 seconds at 100kamp/sec while the load is "off".

6. The method according to claim 1, wherein the Thevenin equivalent source measurements are taken for 2.5 seconds while the load is "on".

7. The method according to claim 1, wherein the Fast Fourier Transform is performed over 60 cycles of Thevenin source measurements.

8. The method according to claim 1, wherein the Fast Fourier Transform is performed over 60 cycles of steady state load waveform measurements and over 60 cycles of Thevenin source measurements.

9. The method according to claim 1, wherein the Fast Fourier Transform averages Thevenin and steady state waveform measurements to reduce noise and momentary changes in waveforms.

10. The method according to claim 1, wherein the step of reconstructing waveforms includes the step of creating a waveform for load current derivative by differentiating a Fourier series of load current.

11. The method according to claim 1, wherein the step of solving time domain is performed using a Least Squares iteration n of system impedance Rhu (n) and $L^{(n)}$ using an over-defined equation.

$$[V_{Th}(t) - V_L(t)] = \left[ I_L(t) \frac{dI_L(t)}{dt} \right] \cdot \begin{bmatrix} R^{(n)} \\ L^{(n)} \end{bmatrix}.$$

12. The method according to claim 1, wherein the Thevenin source voltage is solved using.

$$V_{Th}(t) = \left[ I_L(t) \frac{dI_L(t)}{dt} \right] \cdot \begin{bmatrix} R^{(n)} \\ L^{(n)} \end{bmatrix} + V_L(t).$$

13. The method according to claim 1, wherein the Thevenin source phase angle is calculated using Fast Fourier Transform.

14. The method according to claim 1, further including the step of shifting the Thevenin source voltage and determining $R^{(n+1)}$ and $L^{(n+1)}$.

15. The method according to claim 1, wherein the frequency domain harmonic impedance is calculated using.

$$Z_h = \frac{\Delta V_h}{I_h}.$$

16. The method according to claim 1, further including the step of interpolating the frequency domain driving point impedance.

* * * * *

UNITED STATES PATENT AND TRADEMARK OFFICE
CERTIFICATE OF CORRECTION

PATENT NO. : 8,456,176 B2
APPLICATION NO. : 12/573937
DATED : June 4, 2013
INVENTOR(S) : Rylander et al.

It is certified that error appears in the above-identified patent and that said Letters Patent is hereby corrected as shown below:

In the Claims

Claim 11, Column 12, line 11, "Rhu (n)and", should read --$R^{(n)}$ and--

Signed and Sealed this
Fifteenth Day of October, 2013

Teresa Stanek Rea
*Deputy Director of the United States Patent and Trademark Office*